US007307817B1

(12) United States Patent
Mei

(10) Patent No.: US 7,307,817 B1
(45) Date of Patent: *Dec. 11, 2007

(54) DISK DRIVE SUSPENSION WITH LIMITER FEATURE

(75) Inventor: Shijin Mei, Temecula, CA (US)

(73) Assignee: Magnecomp Corporation, Temecula, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/877,245

(22) Filed: Jun. 25, 2004

Related U.S. Application Data

(63) Continuation of application No. 10/010,997, filed on Nov. 30, 2001, now Pat. No. 6,757,137.

(60) Provisional application No. 60/326,509, filed on Sep. 30, 2001.

(51) Int. Cl.
  *G11B 21/21* (2006.01)
  *G11B 21/22* (2006.01)
(52) U.S. Cl. .................. 360/245.7; 360/245.9
(58) Field of Classification Search ............ 360/245.7, 360/245.9, 245.5
  See application file for complete search history.

(56) References Cited

U.S. PATENT DOCUMENTS 5,781,379 A * 7/1998 Erpelding et al. ....... 360/245.3
5,892,637 A * 4/1999 Brooks et al. ........... 360/234.5
6,021,022 A * 2/2000 Himes et al. ............ 360/245.7
6,147,840 A * 11/2000 Khan ...................... 360/245.9
6,181,525 B1 * 1/2001 Carlson ................... 360/245.7
6,266,214 B1 * 7/2001 Khan ...................... 360/245.9
6,462,911 B1 * 10/2002 Tokuyama et al. ....... 360/245.7
6,757,137 B1 * 6/2004 Mei ........................ 360/245.7

FOREIGN PATENT DOCUMENTS

JP        59151362 A  *  8/1984
JP        2000076812 A *  3/2000

* cited by examiner

Primary Examiner—William J Klimowicz
(74) Attorney, Agent, or Firm—Morrison & Foerster LLP

(57) ABSTRACT

A disk drive suspension and method has a limiter structure that limits movement of the tongue relative to a surrounding frame by extending the plastic film layer and optionally the metal layer components of a flexure-defining flexible circuit laminate beyond the flexure tongue distal end and attaching the terminal regions of the extended components to the surrounding frame laterally of the tongue. The flexure-defining laminate is attached to the suspension rigid portion proximally and optionally distally as well as laterally with the limiter structure. A lift tip can be used to enable lifting of the suspension and to stiffen the suspension in lieu of the distal attachment of the flexible circuit.

21 Claims, 4 Drawing Sheets

DISK DRIVE SUSPENSION WITH LIMITER FEATURE

RELATED APPLICATIONS

This application is a continuation of application Ser. No. 10/010,997 filed Nov. 30, 2001, now U.S. Pat. No. 6,757,137 issued Jun. 29, 2004, which application claims the benefit of Provisional Application Ser. No. 60/326,509, filed Sep. 30, 2001.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention relates to disk drive suspensions, and more particularly to disk drive suspensions of the wireless type that use a flexible circuit supported by a rigid portion of a load beam or stiffener. The invention provides bonding legs laterally of the flexure portion of the suspension that are continued extents of the insulative plastic film or laminates of that film and a base layer for purpose of limiting lateral and vertical shock and thus damage. The continued extents turn reversely from the tongue distal end to lie along the tongue edges spaced laterally of and supported beyond the tongue in tongue excursion limiting relation. Stiffness control is achieved as well as a limiter function.

2. Description of the Related Art

Disk drive suspensions previously known tend to be too stiff for small form factor applications, and limiters continue to need improvement in formability and effectiveness.

BRIEF SUMMARY OF THE INVENTION

It is an object of the invention therefore to provide an improved disk drive suspension. It is a further object to provide a disk drive suspension of the wireless type in which the flexible circuit comprising the trace conductors is used to define a flexure. A further object is to tether the flexure tongue laterally of the flexure tongue edges to limit undue tongue travel. Another object is to provide multiple points of attachment for the flexure and its tethers to effect flexure attachment while controlling stiffness to desired values. A further object is the provision of a front-end lifter and stiffener that reduces or eliminates gluing at the flexure trailing edge. Yet another object is the provision of a suspension using copper-based laminate, or other material-based laminates, as the flexible circuit in preference to stainless steel-based laminates.

These and other objects of the invention to appear hereinafter are realized in a disk drive suspension comprising a rigid portion defining a first dimple locus, a flexible circuit supported by the rigid portion, the flexible circuit comprising a plurality of trace conductors and an insulative plastic film, a flexure at the distal end of the rigid portion comprising a tongue and a tongue support, the tongue comprising a section of the insulative plastic film and defining a second dimple locus opposite the first dimple locus, the insulative plastic film having continued extents arranged to tether the tongue and limit tongue travel away from the rigid portion.

In a further embodiment, the invention provides a disk drive suspension comprising a rigid portion defining a dimple, a flexible circuit supported by the rigid portion, the flexible circuit comprising a plurality of trace conductors and an insulative plastic film, a flexure at the distal end of the rigid portion comprising a cantilevered tongue having left and right side edges and connected to a tongue support between the side edges, the tongue comprising a section of the insulative plastic film and defining a dimple locus opposite the dimple, the insulative plastic film being attached to the tongue support and connecting the tongue support and the tongue, the section having a continued extent beyond the tongue, the continued extent comprising a center continued extent leading away from the section and reversely extending left and right side extents spaced respectively from the tongue left and right side edges, the side extents having respective left and right terminal regions, the terminal regions being attached to the rigid portion left and right of the tongue, the side extents limiting tongue travel away from the rigid portion.

In the foregoing and like embodiments, typically, the flexible circuit is also attached to the rigid portion proximally of the flexure section, the flexible circuit is attached to the rigid portion distally of the flexure section, the flexible circuit is also attached to the rigid portion proximally of the flexure section, or a lift-stiffener may be used, the flexible circuit further including a copper metal layer opposite the traces across the film, the tongue is connected to the tongue support between the side edges, and the continued extent comprises a center continued extent leading away from the section, and the left and right side extents extend reversely relative to the center continued extent.

In a further embodiment, the invention provides a disk drive suspension comprising a rigid portion having an elongated body terminating distally in a flexure support frame and a dimple, a flexible circuit comprising a plurality of trace conductors and an insulative plastic film, a flexure supported by the support frame, the flexure comprising a flexure frame having a base and a tongue cantilever-supported by the frame base, the tongue having left and right side edges, the tongue comprising a section of the insulative plastic film and defining a dimple locus opposite the dimple, and left and right reversely turned continued film extents beyond the tongue attached to the support frame inward of the flexure frame to connect the tongue to the support frame in tongue travel limiting relation.

In this and like embodiments, typically, the flexible circuit is also attached to the rigid portion body proximally of the flexure section, the flexible circuit is attached to the rigid portion support frame distally of the flexure section, the flexible circuit is also attached to the rigid portion body proximally of the flexure section, the flexible circuit further including a copper metal layer opposite the traces across the film, the tongue is connected to the tongue support between the side edges, and there is a center continued extent leading away from the section, the left and right side extents extending reversely relative to the center continued extent.

In all embodiments, the invention can include a lifter structure formed at the distal end of the rigid portion, the lifter structure tending to stiffen the rigid portion, the lifter structure extending distally of the rigid portion, and the flexible circuit can be free of attachment to the rigid portion distally of the flexure section.

In certain embodiments, the rigid portion is deflected as needed to have its distal end substantially parallel with an opposing disk.

In certain embodiments, the flexure includes a frame having a distal part extending laterally of the rigid portion, the rigid portion being locally shaped opposite the frame distal part against wearing engagement of the rigid portion with the flexure frame.

The invention further provides a flexure for a disk drive suspension comprising for support by a rigid portion a flexible circuit laminate of a metal layer, a plurality of trace conductors and an insulative plastic film separating the metal layer from the traces, the laminate being arranged into a tongue and a tongue support, the tongue comprising the insulative plastic film and metal layer and defining a dimple locus, the insulative plastic film having continued extents beyond the tongue arranged to limit tongue travel away from the rigid portion.

In another embodiment, there is provided in accordance with the invention, a disk drive suspension comprising a rigid portion defining a first dimple locus, a flexible circuit supported by the rigid portion, the flexible circuit comprising a laminate of a copper-based metal layer, a plurality of trace conductors and an insulative plastic film separating the metal layer from the traces, a flexure at the distal end of the rigid portion comprising a tongue and a tongue support, the tongue comprising the insulative plastic film and metal layer and defining a second dimple locus opposite the first dimple locus, the insulative plastic film having continued extents arranged to limit tongue travel away from the rigid portion.

In yet another embodiment, the invention disk drive suspension comprises a rigid portion defining a first dimple locus, a flexible circuit supported by the rigid portion, the flexible circuit comprising a laminate of a metal layer, a plurality of trace conductors and an insulative plastic film separating the metal layer from the traces, a flexure at the distal end of the rigid portion comprising a tongue and a tongue support, the tongue comprising the insulative plastic film and metal layer and defining a second dimple locus opposite the first dimple locus, the insulative plastic film having continued extents arranged to limit tongue travel away from the rigid portion.

A further embodiment includes a disk drive suspension comprising a rigid portion defining a dimple, a flexible circuit supported by the rigid portion, the flexible circuit comprising a metal layer, a plurality of trace conductors and an insulative plastic film, a flexure at the distal end of the rigid portion comprising a cantilevered tongue having left and right side edges and connected to a tongue support between the side edges, the tongue comprising a section of the metal and insulative plastic film and defining a dimple locus opposite the dimple, the insulative plastic film being attached to the tongue support and connecting the tongue support and the tongue, the section having a continued extent beyond the tongue, the continued extent comprising a center continued extent leading away from the section and reversely extending left and right side extents spaced respectively from the tongue left and right side edges, the side extents having respective left and right terminal regions, the terminal regions being attached to the rigid portion left and right of the tongue, the side extents limiting tongue travel away from the rigid portion.

In these and like embodiments, typically, the flexible circuit is also attached to the rigid portion proximally and optionally distally of the flexure section, the metal layer is a copper metal layer opposite the traces across the film, the tongue is connected to the tongue support between the side edges, and the continued extent comprises a center continued extent leading away from the section, and the left and right side extents extend reversely relative to the center continued extent.

A further embodiment has a disk drive suspension comprising a rigid portion having an elongated body terminating distally in a flexure support frame and a dimple, a flexible circuit comprising a metal layer, plurality of trace conductors and an insulative plastic film therebetween, a flexure supported by the support frame, the flexure comprising a flexure frame having a base and a tongue cantilever-supported by the frame base, the tongue having left and right side edges, the tongue comprising a section of the insulative plastic film and defining a dimple locus opposite the dimple, and left and right reversely turned continued film extents beyond the tongue attached to the support frame inward of the flexure frame to connect the tongue to the support frame in tongue travel limiting relation.

In this and like embodiments, typically, the tongue is connected to the tongue support between the side edges, there is a center continued extent leading away from the section, and the left and right side extents extending reversely relative to the center continued extent.

As in certain of the previous embodiments, typically, there can be included a lifter structure formed at the distal end of the rigid portion, the lifter structure tending to stiffen the rigid portion, the lifter structure extends distally of the rigid portion, and the flexible circuit is free of attachment to the rigid portion distally of the flexure section, the rigid portion is deflected as needed to have its the distal end substantially parallel with an opposing disk, and the flexure includes a frame having a distal part extending laterally of the rigid portion, the rigid portion being locally shaped opposite the frame distal part against interference of the rigid portion with the flexure frame.

Further, typically, in certain embodiments, the flexure frame has a distal part extending laterally of the rigid portion support frame, the rigid portion being locally shaped opposite the frame distal part against interference of the rigid portion with the flexure frame.

In its method aspects the invention contemplates a method of limiting the movement of a flexure tongue relative to a surrounding frame, including maintaining a plastic film layer movable with the tongue, providing an extension of the plastic film beyond the distal perimeter of the tongue and connecting the plastic film extension to the surrounding frame laterally of the tongue and proximally of the tongue distal perimeter.

BRIEF DESCRIPTION OF THE SEVERAL VIEWS OF THE DRAWINGS

The invention will be further described in conjunction with the attached drawings in which.

DETAILED DESCRIPTION OF THE INVENTION

Figure 1:
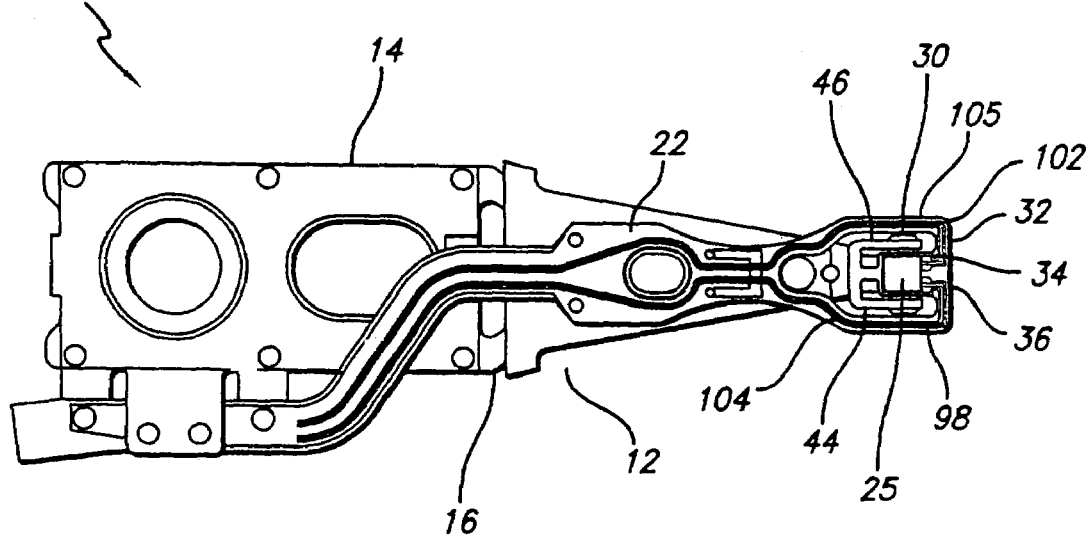
FIG. 1 is a bottom plan view of the complete invention suspension.

The invention uses added points of attachment laterally of the flexure to increase control over pitch and roll stiffness and have lower stiffness in very small suspensions such as femto form factor suspensions. The invention uses bonding legs from the flexure tongue area, generally formed from continued extents of the flexible circuit section in the tongue area, as anchors to adjust pitch and roll stiffness and also to act as a limiter structure for slider loading and unloading. Vertical and lateral shock damage to the suspension is prevented by the bonding leg anchors. Compared to conventional trace suspension assemblies, the present device does not require a stainless steel base layer. A flexible circuit is employed that uses no base layer, or preferably a copper metal layer or other metal or plastic base layer, an insulative film layer such as polyimide, and trace conductors such as copper traces. The copper base layer will typically be over-plated with gold or nickel/gold plating composition, or other material to limit environmental degradation. The thickness of a flexible circuit laminate base layer of copper metal will be about 0.005 to about 0.01 mm. A conventional stainless steel base layer, however, can be used as or in addition to the copper metal or other base layer where thickness and stiffness property requirements of the application are met. The new flexible circuit is bondable to the suspension rigid portion. Attachment by gluing, welding or laminating processes is suitable.

Stiffness control is maintained by placing glue laterally of the flexure on the terminal regions of the anchor legs formed by the flexure section continued extents, and at the trailing edge of the flexure which increases lateral stiffness remarkably. The invention provides good control over flexure stiffness properties, such as a pitch stiffness Kp of 0.79 uNM/deg, roll stiffness Kr of 0.71 uNM/deg and a very high lateral stiffness KI of 22.4 N/mm.

In an alternate form, flexure trailing edge gluing is omitted and a stiffener/lifter is added, giving a pitch stiffness Kp of 0.51 uNM/deg, a Kr of 0.70 uNM/deg and a lateral stiffness KI of 8.4 N/mm.

In the invention, pitch adjustment is not needed in some embodiments as the suspension rigid portion is formed with a desired angle that forces the flexure tongue to be parallel to the disk opposed in the installed condition of the suspension. A lifter can be readily incorporated into the design, increasing stiffness and optionally making unnecessary any trailing edge gluing of the flexure.

With reference now to the drawings in detail, in FIGS. 1–5 disk drive suspension 10 is shown to comprise a rigid portion 12 integral with or separate from and connected to load beam base portion 14 and spring portion 16. Rigid portion 12 defines a first dimple locus 18. A dimple locus herein is a dimple per se, i.e. a rounded protuberance that projects from a surrounding surface such as the surface of the load beam rigid portion, and/or a dimple locus can be a surface that is the target of the projecting dimple that can typically be formed on the tongue. Thus the term dimple locus covers both the protuberant dimple as the locus and the target surface, be it flat or rounded, as the dimple locus.

Flexible circuit 22 extends from the device electronics (not shown) along the suspension 10 from base portion 14, past spring portion 16 and to rigid portion 12 that supports the flexible circuit.

Flexible circuit 22 comprises a laminate 23 of a plurality of trace conductors 24 defining read/write circuits between the device electronics and slider 25 (FIG. 2B), an insulative plastic film 26, and a copper metal (or other base material hereinafter described) base layer 28.

Figure 6:
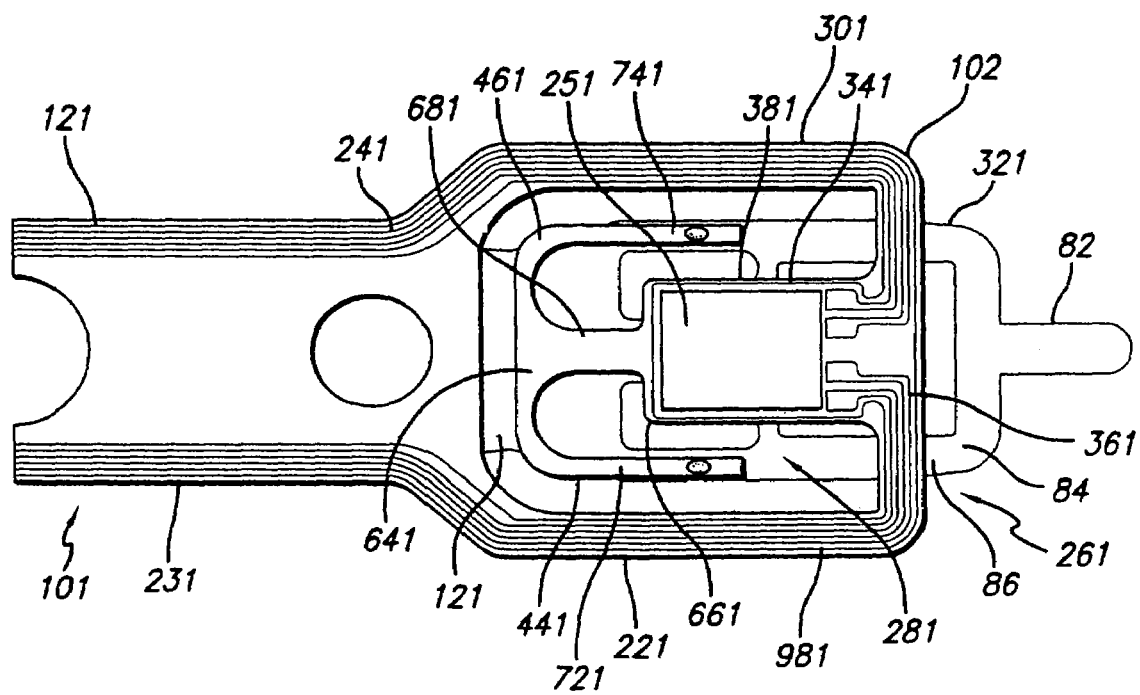
FIG. 6 is a view like FIG. 3B of an alternate form of the invention.
Figure 2A:
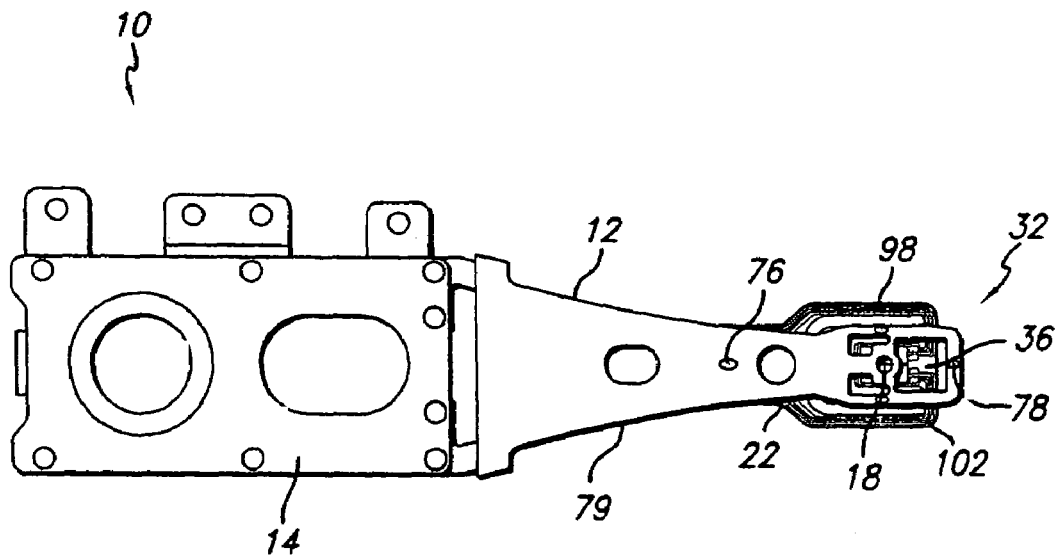
FIG. 2A is a top plan view of a part of the suspension.
Figure 2B:
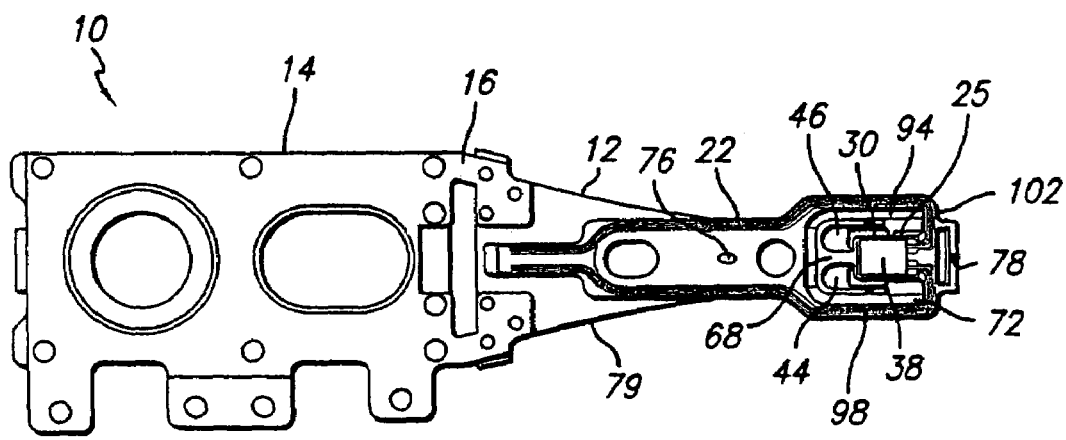
FIG. 2B is a bottom plan view of a part of the suspension.

In the embodiment of FIG. 6, the flexible circuit 221 comprises a laminate 231 of a plurality of trace conductors 241 defining read/write circuits and an insulative plastic film 261. No base layer of copper, stainless steel or other material is present. The FIG. 6 embodiment is otherwise like the FIGS. 1–5 embodiment now to be described with like parts having like numerals plus a terminal 1, e.g. 26 in FIGS. 1–5 is 261 in FIG. 6.

In the embodiment of FIGS. 1–5, flexible circuit 22 defines a flexure 30 at the distal end 32 of the rigid portion 12. Flexure 30 comprises a tongue 34 and a tongue support 36. Tongue 34 comprises a generally rectangular section 38 of laminate 23 including the insulative plastic film 26 and copper metal base layer 28 (28 not present in tongue 341 in FIG. 6). Tongue 34 defines a second dimple locus 42 opposite the first dimple locus 18.

Insulative plastic film 26 (or 261) has left and right continued tethers or extents 44 (441), 46 (461) arranged to limit tongue 34 (341) travel away from the rigid portion 12 (121) for purposes to be described hereinafter.

With further reference to FIGS. 1–5, the suspension rigid portion 12 defines as the first dimple locus 18 a projecting dimple 48 that extends from the surface 52 of the rigid portion 12 toward the second dimple locus 42 which in this embodiment is a flat 54 that will permit the tongue 34 and its carried slider 25 to gimbal about the dimple.

Tongue 34 has left and right side edges 56, 58 respectively, and is cantilevered from its proximate end 62 that is connected to tongue support 36 at a location between the side edges. Insulative plastic film 26 and/or base metal layer 28 are attached to the tongue support 36 and connect the tongue support and the tongue 34. Tongue 34 comprises the section 38 that has an insulative film 26—constituted continued extent 64 beyond the distal end 66 of the tongue. Continued extent 64 comprises a center continued extent 68 leading away from the section 28 and reversely extending (as shown) left and right side extents 44, 46 spaced respectively from the tongue left and right side edges 56, 58. Side extents 44, 46 have respective left and right terminal regions 72, 74, attached respectively to the suspension 10 beyond the tongue 34, e.g. to the rigid portion 12 at locations 35, 37 to the left and right of the tongue. These side extents 44, 46 are shaped and sized and are sufficiently inextensible under the load imposed by the tongue 34 and the slider 25 during suspension operation to limit tongue travel away from the rigid portion 12 to a degree determined by the design but which typically prevents the slider from touching the disk (not shown).

In further detail, the flexible circuit 22 is also attached to the rigid portion 12 proximally of the flexure section at 76 and optionally distally thereof at 78 along the elongated body 79 of the rigid portion.

In FIG. 6, the flexible circuit 221 is not glued or otherwise attached to the rigid portion other than at the flexure side extent terminals 721, 741 reducing stiffness attributable to the attachment. In FIG. 6 a front-end lifter 82 is provided extending from the rigid portion 121. Lifter 82 and its support 84 at the distal end 86 of the rigid portion 121 tend to stiffen the flexure there but with less stiffening than with gluing of the flexure 30 to the rigid portion as shown in FIGS. 1–5.

Figure 3A:
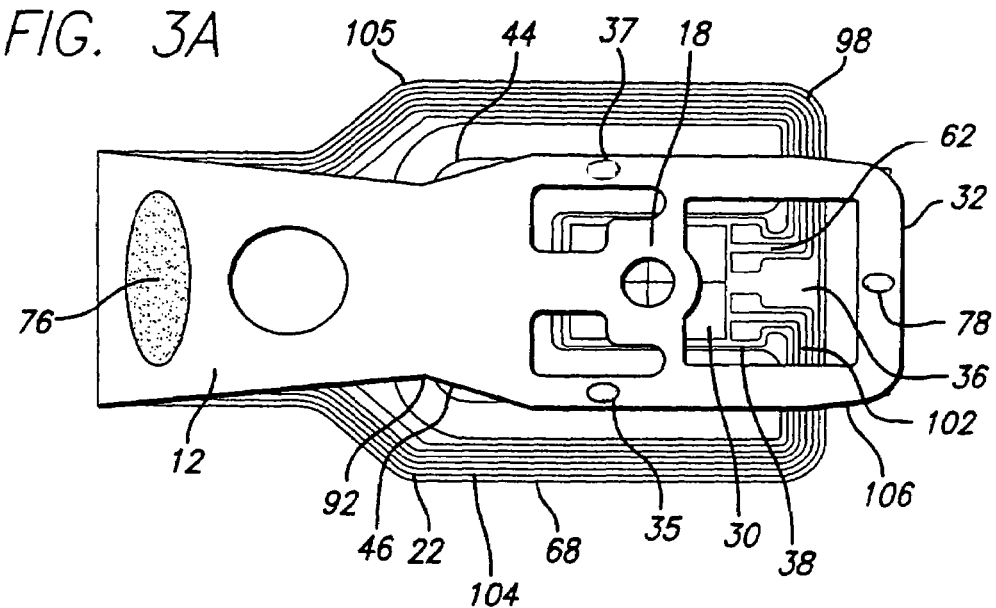
FIG. 3A is a further top plan view thereof.
Figure 3B:
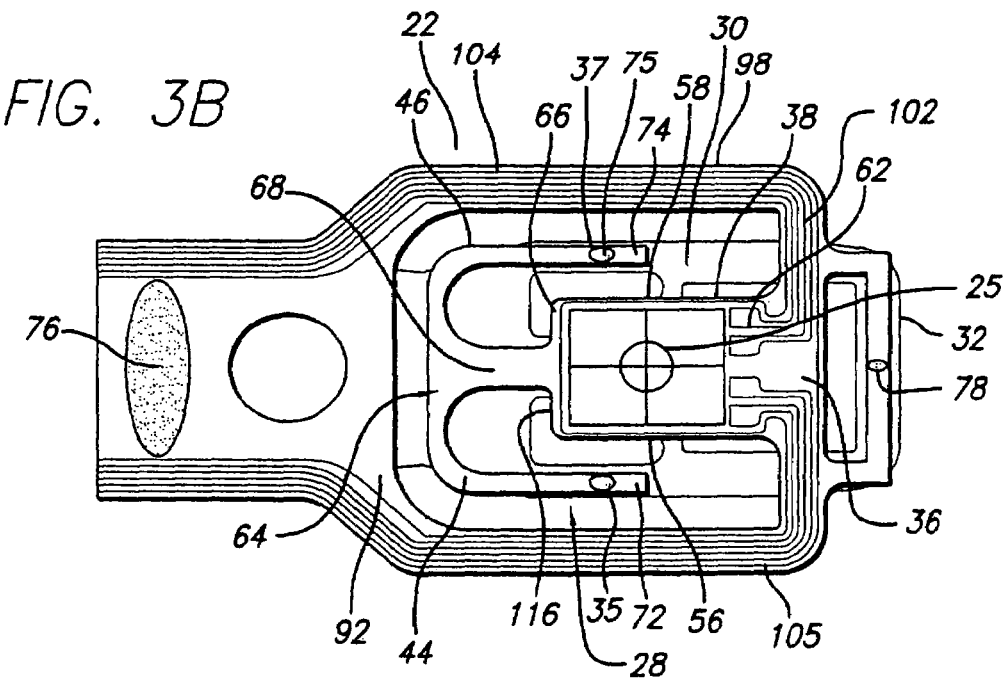
FIG. 3B is a bottom plane view thereof.
Figure 3C:
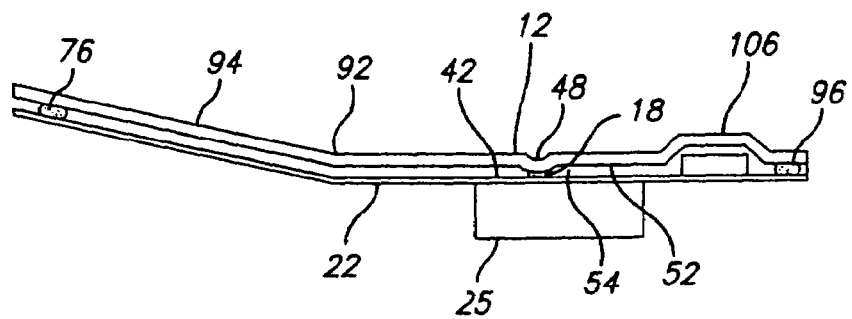
FIG. 3C is a side elevation view thereof.

With particular reference to FIGS. 3A, 3B and 3C, the rigid portion 12 is deflected along a transverse line 92 proximally of the flexure 30 to counteract the sag bend 94 condition shown, as needed to have the suspension distal end 96 and the flexure carried slider 25 substantially parallel with an opposing disk.

In further reference to FIGS. 3A, 3B, and 3C the flexure 30 has a generally rectangular frame 98 having a distal cross member 102 defining the tongue support 36 and lateral members 104, 105 extending in spaced relation laterally of the rigid portion 12. Cross-member 102 defines the distal end of flexure frame 98 to extend across the rigid portion 12. Rigid portion 12 being locally shaped at 106 opposite the frame distal cross-member 102 against wearing engagement of the rigid portion with the flexure frame 28.

Figure 4:
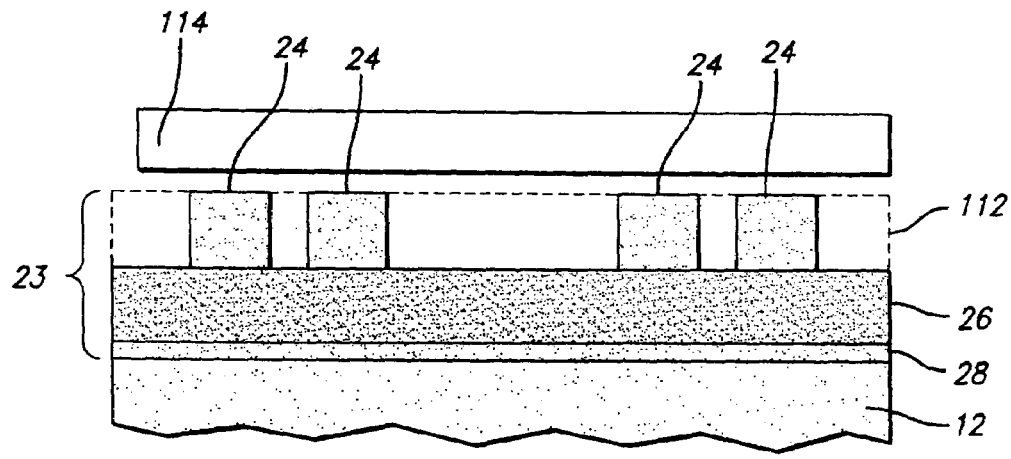
FIG. 4 is a view in vertical section of the distal portion of the suspension.
Figure 5:
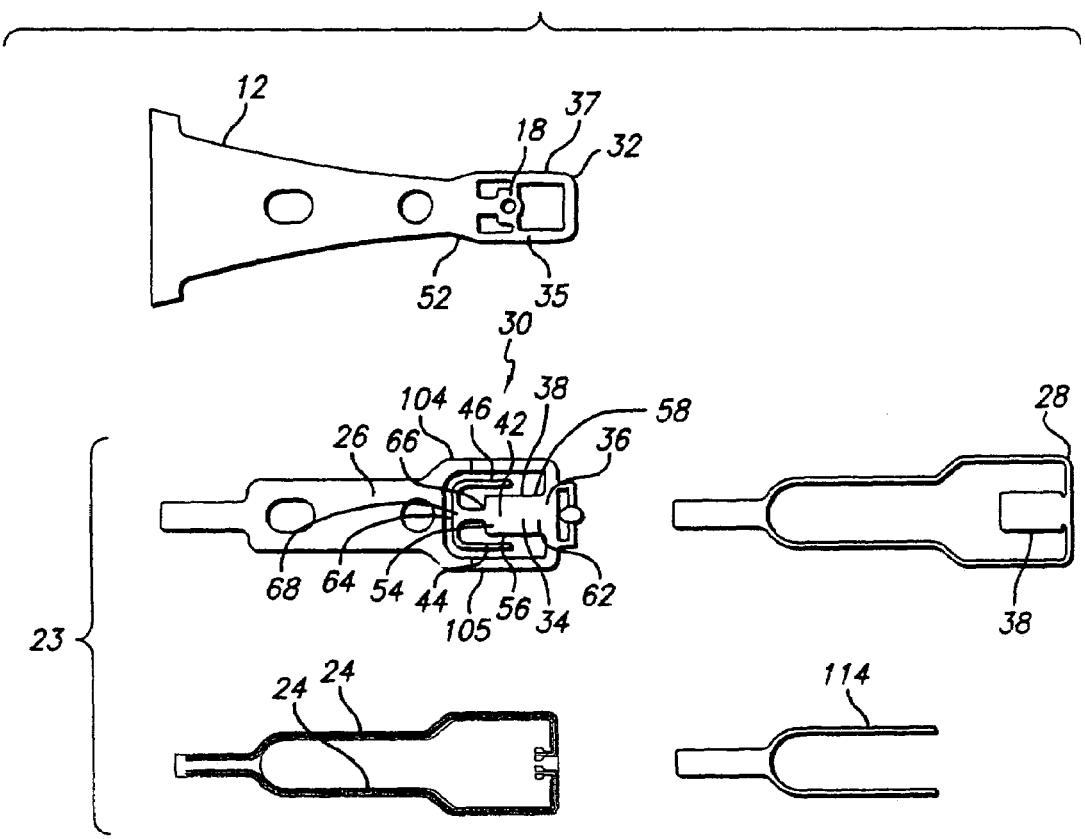
FIG. 5 is an exploded view of the suspension distal portion.

With particular reference to FIGS. 4 and 5, the invention flexure 30 for a disk drive suspension preferably comprises for support by a rigid portion 12 a flexible circuit laminate 23 comprising a base metal layer 28, such as copper metal (metal containing a major weight amount of copper), or other suitable base material including stainless steel, the copper base layer having a thickness of between about 0.005 and 0.01 mm., a plurality of trace conductors 24 formed from a trace layer 112 having a thickness of about 0.018 mm., an insulative plastic film layer 26, such as a polyimide film having a thickness of about 0.025 mm., the laminate being supported by a stiffener or load beam rigid portion 12 suitably of stainless steel and having a thickness of about 0.0760 to 0.1020 mm., and in some cases having a cover layer 114 of plastic having a thickness about 0.005 to about 0.008 mm.

Insulative film 26 separates the metal base layer 28 from the traces 24, the laminate 23 being arranged into the tongue 34 and the tongue support 36, the tongue comprising the insulative plastic film 26 and base metal layer 28 and defining a second dimple locus 42, the insulative plastic film having continued extents 44, 46 beyond the tongue arranged to limit tongue travel away from the rigid portion 12.

In its method aspects, the invention contemplates a method of limiting the movement of a flexure tongue 34 relative to a surrounding frame 98, including maintaining a plastic film layer 26 movable with the tongue, providing an extension 64 of the plastic film beyond the distal perimeter 66 of the tongue and connecting the plastic film extension to the surrounding frame laterally of the tongue and proximally of the tongue distal perimeter.

The invention thus provides an improved disk drive suspension of the wireless type in which the flexible circuit comprising the trace conductors is used to define a flexure in which the flexure tongue is tethered laterally of the flexure tongue edges to limit undue tongue travel. The invention further provides multiple points of attachment for the flexure and its tethers to effect flexure attachment while controlling stiffness to desired values, and a front-end lifter and stiffener that reduces or eliminates gluing at the flexure trailing edge. The invention provides a suspension using copper-based laminate, or other material-based laminates, as the flexible circuit in preference to stainless steel-based laminates.

The foregoing objects are thus met.

I claim:

1. A disk drive suspension comprising a rigid portion defining a first dimple locus, a flexible circuit supported by said rigid portion, said flexible circuit comprising a plurality of trace conductors and an insulative plastic film, and adjacent the distal end of said rigid portion a flexure comprising a tongue support and a tongue for carrying a slider in operative association with a disk, said tongue defining a second dimple locus opposite said first dimple locus and having left and right side edges, said insulative plastic film having a continued extent attached laterally of said tongue left and right side edges to said rigid portion in tongue travel limiting relation.

2. The disk drive suspension according to claim 1, in which said flexible circuit is attached to said rigid portion proximally of said flexure.

3. The disk drive suspension according to claim 1, in which said flexible circuit is attached to said rigid portion distally of said flexure.

4. The disk drive suspension according to claim 3, in which said flexible circuit is also attached to said rigid portion proximally of said flexure, said flexible circuit further including a copper metal layer opposite said trace conductors across said insulative film.

5. The disk drive suspension according to claim 1, in which said there is a lateral gap between said tongue left and right side edges and said tongue support, said flexible circuit continued extent extending across said lateral gap.

6. The disk drive suspension according to claim 1, including also a lifter structure formed at the distal end of said rigid portion, said lifter structure tending to stiffen said rigid portion.

7. The disk drive suspension according to claim 6, in which said lifter structure extends distally of said rigid portion, and said flexible circuit is free of attachment to said rigid portion distally of said flexure.

8. A disk drive suspension comprising a rigid portion defining a first dimple locus, a flexible circuit supported by said rigid portion, said flexible circuit comprising a plurality of trace conductors and an insulative plastic film, and adjacent the distal end of said rigid portion a flexure comprising a tongue support and a tongue for carrying a slider in operative association with a disk, said tongue defining a second dimple locus opposite said first dimple locus, said insulative plastic film having a continued extent laterally of and attached to said tongue in tongue travel limiting relation, said tongue having left and right side edges and connection in cantilevered relation to a portion of said tongue support between said side edges, said tongue being free of insulative film continued extent opposite said tongue support portion.

9. A disk drive suspension comprising a rigid portion defining a dimple, a flexible circuit supported by said rigid portion, said flexible circuit comprising a plurality of trace conductors and an insulative plastic film, and a flexure adjacent the distal end of said rigid portion, said flexure comprising a cantilevered tongue having left and right side edges and connected to a tongue support between said side edges, said tongue defining a dimple locus opposite said dimple, said insulative plastic film having a continued extent comprising a center continued extent leading away from said tongue and reversely extending left and right side extents spaced respectively from said tongue left and right side edges, said side extents having respective left and right terminal regions, said terminal regions being attached to said rigid portion beyond said left and right edges of said tongue, said side extents limiting tongue travel away from said rigid portion.

10. The disk drive suspension according to claim 9, in which said flexible circuit is also attached to said rigid portion proximally of said flexure.

11. The disk drive suspension according to claim 9, in which said flexible circuit is attached to said rigid portion distally of said flexure.

12. The disk drive suspension according to claim 11, in which said flexible circuit further includes a copper metal layer opposite said trace conductors across said film.

13. The disk drive suspension according to claim to claim 9, in which said tongue is connected to said tongue support between said side edges.

14. The disk drive suspension according to claim 13, in which said left and right side extents extend reversely relative to said center continued extent.

15. The disk drive suspension according to claim 9, including also a slider carried by said tongue.

16. A flexure for a disk drive suspension comprising for support by a suspension rigid portion a flexible circuit laminate of a metal layer, a plurality of trace conductors and an insulative plastic film separating said metal layer from said trace conductors arranged into a tongue having left and right side edges and a tongue support, said insulative plastic film having continued extents laterally of said tongue left and right side edges and attachable to said rigid portion beyond said tongue to limit tongue travel away from said rigid portion.

17. A disk drive suspension comprising a rigid portion defining a first dimple locus, a flexible circuit supported by said rigid portion, said flexible circuit comprising a laminate of a copper-based metal layer, a plurality of trace conductors and an insulative plastic film separating said metal layer from said trace conductors, and a flexure at the distal end of said rigid portion comprising a tongue having left and right edges and a tongue support, said tongue defining a second dimple locus opposite said first dimple locus, said insulative plastic film having continued extents laterally of said tongue left and right edges and arranged to limit tongue travel away from said rigid portion.

18. A disk drive suspension comprising a rigid portion, a flexible circuit supported by said rigid portion, said flexible circuit comprising a plurality of trace conductors and a flexible circuit insulative plastic film, and a flexure at the distal end of said rigid portion comprising a cantilevered tongue having left and right side edges and connected to a tongue support between said side edges, said tongue comprising an insulative plastic film, said tongue insulative plastic film having a continued extent beyond said tongue, said continued extent comprising a center continued extent leading away from said tongue and reversely extending left and right side extents spaced respectively from said tongue left and right side edges, said side extents having respective left and right terminal regions, said terminal regions being attached to said rigid portion left and right of said tongue, said side extents limiting tongue travel away from said rigid portion.

19. The disk drive suspension according to claim 18, in which said side extents extend reversely.

20. A disk drive suspension comprising a rigid portion having an elongated body terminating distally in a flexure support, a flexible circuit comprising a plurality of trace conductors and a flexible circuit insulative plastic film, a flexure supported by said support, said flexure comprising a flexure frame having a base and a tongue cantilever-supported by said frame base, said tongue having left and right side edges, and left and right reversely turned continued film extents beyond said tongue attached to said support, said continued film extents connecting said tongue to said support in tongue travel limiting relation.

21. A method of limiting the movement of a flexure tongue having left and right side edges relative to a surrounding frame, including maintaining a plastic film layer movable with said tongue, providing an extension of said plastic film layer laterally of said tongue left and right edges, and connecting said plastic film layer extension to said surrounding frame laterally of said tongue left and right side edges in flexure tongue movement limiting relation.

\* \* \* \* \*

UNITED STATES PATENT AND TRADEMARK OFFICE
CERTIFICATE OF CORRECTION

PATENT NO. : 7,307,817 B1 Page 1 of 1
APPLICATION NO. : 10/877245
DATED : December 11, 2007
INVENTOR(S) : Shijin Mei It is certified that error appears in the above-identified patent and that said Letters Patent is hereby corrected as shown below:

Column 8, line 16, after "which", delete "said".

Column 9, line 1, after "to claim" delete "to claim".

Signed and Sealed this

Eighth Day of April, 2008

JON W. DUDAS
*Director of the United States Patent and Trademark Office*